United States Patent
Doscher et al.

(10) Patent No.: US 9,348,088 B2
(45) Date of Patent: *May 24, 2016

(54) SYSTEMS AND METHODS FOR PASSIVE ALIGNMENT OF OPTO-ELECTRONIC COMPONENTS

(71) Applicant: ANALOG DEVICES, INC., Norwood, MA (US)

(72) Inventors: James Doscher, Westford, MA (US); Shrenik Deliwala, Andover, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/340,963

(22) Filed: Jul. 25, 2014

(65) Prior Publication Data

US 2014/0334772 A1    Nov. 13, 2014

Related U.S. Application Data

(63) Continuation of application No. 13/411,375, filed on Mar. 2, 2012, now Pat. No. 8,842,951.

(51) Int. Cl.
*G02B 6/42* (2006.01)
*G02B 6/12* (2006.01)
*H01L 23/544* (2006.01)
(Continued)

(52) U.S. Cl.
CPC ................ *G02B 6/12* (2013.01); *G02B 6/4231* (2013.01); *H01L 23/544* (2013.01); *H01L 31/02* (2013.01); *H01L 31/167* (2013.01); *H05B 7/18* (2013.01); *H05K 3/303* (2013.01); *G02B 6/4214* (2013.01); *H01L 2223/54426* (2013.01); *H01L 2223/54473* (2013.01); *H01L 2224/48091* (2013.01); *H05K 2201/10121* (2013.01); *H05K 2203/167* (2013.01); *Y02P 70/613* (2015.11); *Y10T 29/41* (2015.01); *Y10T 29/49002* (2015.01); *Y10T 29/4913* (2015.01)

(58) Field of Classification Search
None
See application file for complete search history.

(56) References Cited

U.S. PATENT DOCUMENTS 5,247,597 A    9/1993    Blacha et al.
5,340,420 A    8/1994    Ozimek et al.
(Continued)

FOREIGN PATENT DOCUMENTS

DE    19909242 A1    8/2000
EP    1276142 A2    1/2003
(Continued)

OTHER PUBLICATIONS

Office Action mailed Apr. 11, 2014 in U.S. Appl. No. 13/462,604, filed May 2, 2012 in 14 pages.
(Continued)

*Primary Examiner* — Sung Pak
(74) *Attorney, Agent, or Firm* — Knobbe, Martens, Olson & Bear LLP

(57) ABSTRACT

A method for aligning an opto-electronic component in an IC die with an optical port is disclosed. This is achieved, in various embodiments, by forming alignment features in the IC die that can mate with complementary alignment features of the optical port. The formation of alignment features can be performed at the wafer level during fabrication of the IC die. An optical signal carrier may be optically coupled to the optical port such that the signal carrier may communicate optically with the opto-electronic component.

31 Claims, 7 Drawing Sheets

(51) Int. Cl.
*H05B 7/18* (2006.01)
*H05K 3/30* (2006.01)
*H01L 31/02* (2006.01)
*H01L 31/167* (2006.01)

(56) References Cited

U.S. PATENT DOCUMENTS

| | | | |
|---|---|---|---|
| 5,421,928 | A | 6/1995 | Knecht et al. |
| 5,500,505 | A | 3/1996 | Jones |
| 5,643,472 | A | 7/1997 | Engelsberg et al. |
| 6,113,835 | A | 9/2000 | Kato et al. |
| 6,335,224 | B1 | 1/2002 | Peterson et al. |
| 6,352,880 | B1 | 3/2002 | Takai et al. |
| 6,379,988 | B1 | 4/2002 | Peterson et al. |
| 6,531,328 | B1 | 3/2003 | Chen |
| 6,576,867 | B1 | 6/2003 | Lu et al. |
| 6,602,430 | B1 | 8/2003 | Nally et al. |
| 6,864,460 | B2 | 3/2005 | Cummings et al. |
| 6,869,231 | B2 | 3/2005 | Chiu et al. |
| 6,878,564 | B2 | 4/2005 | Silverbrook |
| 6,878,900 | B2 | 4/2005 | Corkum et al. |
| 6,915,049 | B2 | 7/2005 | Murata |
| 6,930,398 | B1 | 8/2005 | Sun et al. |
| 7,049,639 | B2 | 5/2006 | Wang et al. |
| 7,279,343 | B1 | 10/2007 | Weaver et al. |
| 7,405,487 | B2 | 7/2008 | Brand |
| 7,442,559 | B2 | 10/2008 | Auburger et al. |
| 7,720,337 | B2 | 5/2010 | Lu et al. |
| 7,807,505 | B2 | 10/2010 | Farnworth et al. |
| 8,399,994 | B2 | 3/2013 | Roh et al. |
| 8,538,215 | B2 | 9/2013 | Deliwala et al. |
| 8,601,677 | B2 | 12/2013 | Doany et al. |
| 8,842,951 | B2 * | 9/2014 | Doscher .................. 385/52 |
| 2002/0021874 | A1 | 2/2002 | Giboney et al. |
| 2002/0181882 | A1 | 12/2002 | Hibbs-Brenner et al. |
| 2003/0197292 | A1 | 10/2003 | Huang |
| 2003/0219217 | A1 | 11/2003 | Wickman et al. |
| 2004/0037507 | A1 | 2/2004 | Marion et al. |
| 2005/0087522 | A1 | 4/2005 | Sun et al. |
| 2005/0135071 | A1 | 6/2005 | Wang et al. |
| 2005/0226569 | A1 | 10/2005 | Sashinaka et al. |
| 2006/0001116 | A1 | 1/2006 | Auburger et al. |
| 2006/0027479 | A1 | 2/2006 | Auburger et al. |
| 2006/0045421 | A1 | 3/2006 | Baets et al. |
| 2006/0049548 | A1 | 3/2006 | Auburger et al. |
| 2006/0126331 | A1 | 6/2006 | Chien |
| 2007/0222041 | A1 | 9/2007 | Weng et al. |
| 2008/0079019 | A1 | 4/2008 | Huang et al. |
| 2008/0157252 | A1 | 7/2008 | Cheng et al. |
| 2009/0011522 | A1 | 1/2009 | Drennan et al. |
| 2009/0014857 | A1 | 1/2009 | Hufgard |
| 2009/0046144 | A1 | 2/2009 | Tuttle |
| 2009/0070727 | A1 | 3/2009 | Solomon |
| 2009/0134481 | A1 | 5/2009 | Sengupta |
| 2009/0189177 | A1 | 7/2009 | Lee et al. |
| 2009/0213262 | A1 | 8/2009 | Singh et al. |
| 2009/0218588 | A1 | 9/2009 | Panaccione et al. |
| 2009/0226130 | A1 | 9/2009 | Doany et al. |
| 2009/0269006 | A1 | 10/2009 | Ishikawa et al. |
| 2010/0019393 | A1 | 1/2010 | Hsieh et al. |
| 2010/0187557 | A1 | 7/2010 | Samoilov et al. |
| 2010/0200998 | A1 | 8/2010 | Furuta et al. |
| 2010/0244217 | A1 | 9/2010 | Ha et al. |
| 2011/0062572 | A1 | 3/2011 | Steijer et al. |
| 2011/0176765 | A1 | 7/2011 | Lee |
| 2011/0286690 | A1 | 11/2011 | Deliwala et al. |
| 2012/0027234 | A1 | 2/2012 | Goida |
| 2013/0285185 | A1 | 10/2013 | Park et al. |
| 2013/0292786 | A1 | 11/2013 | Sengupta |
| 2014/0027867 | A1 | 1/2014 | Goida |

FOREIGN PATENT DOCUMENTS

| | | |
|---|---|---|
| WO | WO 01/68460 | 9/2001 |
| WO | WO 2007/005636 A2 | 1/2007 |

OTHER PUBLICATIONS

Office Action mailed Jun. 17, 2014 in U.S. Appl. No. 13/560,855, filed Jul. 27, 2012 in 11 pages.

\* cited by examiner

SYSTEMS AND METHODS FOR PASSIVE ALIGNMENT OF OPTO-ELECTRONIC COMPONENTS

CROSS-REFERENCE TO RELATED APPLICATION

This application is a continuation of U.S. application Ser. No. 13/411,375, filed Mar. 2, 2012, titled "SYSTEMS AND METHODS FOR PASSIVE ALIGNMENT OF OPTO-ELECTRONIC COMPONENTS," the entire disclosure of which is hereby incorporated herein by reference.

FIELD OF THE INVENTION

Embodiments of the invention relate to methods of aligning optical components and devices for opto-electronic systems.

BACKGROUND

When opto-electronic devices and components are to be connected to each other, such as an optical emitter or receiver to an optical fiber, the devices must be precisely aligned in order for the overall assembly to operate properly. For example, the optical axis of an emitter, such as a semiconductor laser, must be precisely aligned with that of the optical fiber, so that a laser beam emitted from the semiconductor laser enters the optical fiber properly. Standard tolerances for the precision of such alignment range from ±25 µm to ±1 µm. Accordingly, alignment is widely recognized as the most expensive phase of assembling optical packages and often represents 25-50% of packaging costs.

Two methods of aligning optical devices are well known in the art. In "active alignment," one optical device (typically the emitter) is turned on during the alignment process. The light beam emanating from the emitter passes through the fiber and is detected by a photodetector at the other end of the fiber. Relative movement between the emitter and the optical fiber is imparted until the photodetector detects a high or maximum light intensity, which indicates a desirable alignment between the optical fiber and the emitter. A similar process can be used to in aligning an optical fiber and a photodetector, in which relative movement between the optical fiber and the photodetector is imparted until satisfactory alignment is achieved. This trial-and-error method of active alignment requires the optical devices to be connected into an operational circuit during the packaging process, is time-consuming and results in high fabrication costs.

In "passive alignment," optical devices need not be on to set the alignment, and advantage can be taken of alignment markers created during manufacturing of the devices to be aligned. However, in order to meet today's stringent alignment tolerances, expensive machine vision and 6-axis robotics are typically employed, and the process remains cumbersome and expensive.

As the data rates of computing backplanes (and consumer products such as video and mobile devices connecting to the backplanes) continue to increase, optical interconnections are expected to be preferred over copper lines. Therefore, there is a need for a low-cost, passive optical alignment method.

SUMMARY OF THE INVENTION

In one embodiment, an opto-electronic system comprises an optical port and an integrated circuit (IC) die. The optical port is configured to be coupled to at least one signal carrier. The optical port further includes first three-dimensional (3D) alignment features. The IC die comprises at least one opto-electronic component, and second 3D alignment features complementary to the first alignment features. When the first and second 3D alignment features are mated, and the optical signal carrier is coupled to the optical port, the optical signal is aligned with the opto-electronic component.

In another embodiment, a method of fabricating a device comprises providing an integrated circuit with at least one opto-electronic component, and forming first 3D alignment features in the integrated circuit. The first 3D alignment features are configured to mate with complementary second 3D alignment features of an optical port, such that upon mating of the first 3D alignment features with the second 3D alignment features, the relative positions of the integrated circuit and the optical port are stably established.

In yet another embodiment, an IC die configured to receive an aligned optical port thereon comprises at least one opto-electronic component integrated with the IC die, the opto-electronic component configured to optically communicate with an optical port. The IC die further comprises first 3D alignment features at locations spaced apart from the opto-electronic component and configured to be mated with complementary second 3D alignment features of the optical port, such that upon mating of the first 3D alignment features with the second 3D alignment feature, the relative positions of the IC die and the optical port are stably established.

In another embodiment, a method of attaching an optical port to an IC comprises providing an optical port with first 3D alignment features, providing an IC with at least one opto-electronic component and second 3D alignment features complementary to the first, and positioning the optical port over the opto-electronic component by mating the first 3D alignment features with the second 3D alignment features.

In still another embodiment, an opto-electronic system comprises an IC die configured to receive an optical fiber, the IC die having a top surface and a bottom surface. An opto-electronic component is positioned closer to the top surface than the bottom surface of the IC die. An alignment hole is located in the bottom surface of the IC die directly beneath the opto-electronic component, wherein the alignment hole does not extend completely through the IC die, and wherein the depth of the alignment hole is such that the opto-electronic component can optically communicate from a bottom side of the IC die. The alignment hole is configured to receive an optical fiber such that upon insertion of the optical fiber into the alignment hole, the relative positions of the IC die and the optical port fiber are stably established.

Various embodiments disclosed herein can be used generally where alignment between optical components (e.g., optical fibers) and integrated circuits is desired, such as for fiber-optic communications, imaging, sensing, or LED or laser transmission. For example, embodiments taught herein can be adapted to using fiber Bragg gratings in optical fiber sensors. Other applications are possible, as will be understood by one of skill in the art.

BRIEF DESCRIPTION OF THE DRAWINGS

The invention and various embodiments and features may be better understood by reference to the following drawings in which.

DETAILED DESCRIPTION OF EMBODIMENTS

Figure 1:
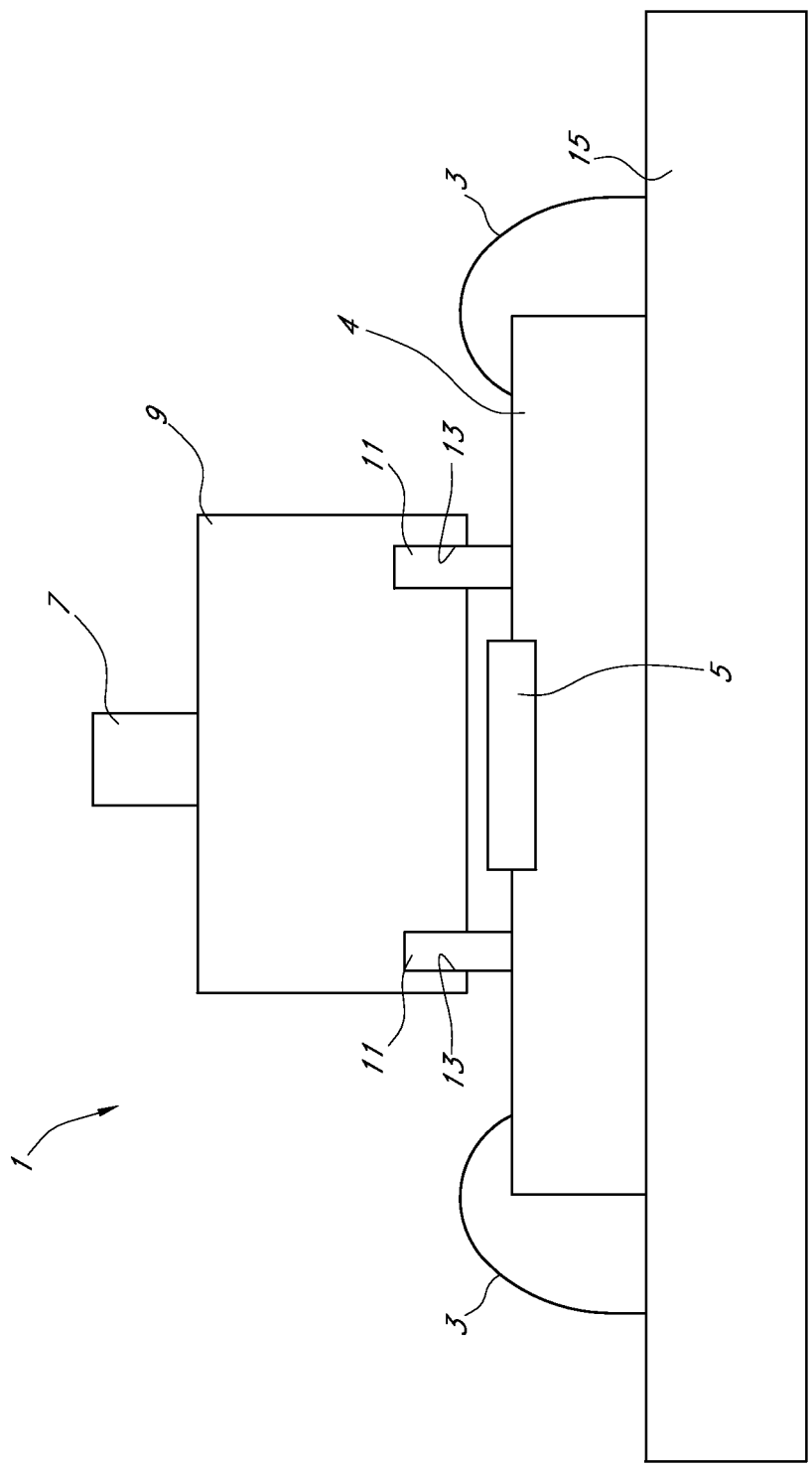
FIG. 1 shows a schematic view of an opto-electronic system, according to an embodiment.

The following detail description of certain embodiments presents various descriptions of specific embodiments of the invention. However, the invention can be embodied in myriad different ways as defined and covered by the claims. In this description, reference is made to the drawings where like reference numerals indicate identical or functionally similar elements.

FIG. 1 shows a schematic view of an opto-electronic system 1 according to an embodiment. An integrated circuit (IC) die 4 includes an opto-electronic component 5. The opto-electronic component 5 can be, for example, a photodiode integrated within the semiconductor substrate of the IC die 4, a discrete photodiode integrated or mounted onto the IC die 4, a laser integrated within the semiconductor substrate of the IC die 4, or a discrete laser integrated or mounted onto the IC die 4. An optical signal carrier 7 is coupled to an optical port 9 which is positioned over the opto-electronic component 5. The optical signal carrier 7 may be, for example, an optical fiber, a ribbon sheathing multiple optical fibers, or other means for carrying an optical signal. As used herein, "optical fiber" means an optical fiber core and the cladding surrounding and integrated with the core. An additional jacket or buffer layer may surround the optical fiber, in certain embodiments. The optical port 9 coupled to the optical signal carrier 7 permits optical communication between the optical signal carrier 7 and the opto-electronic component 5. The optical port 9 can include, for example, an optical fiber ferrule, with or without a turning mirror, a lens array, a waveguide, a planar light circuit, an optical coupler, a modulator, or the outer surface of the cladding surrounding and integrated with an optical fiber (see, e.g., FIG. 6 and corresponding description below). The IC die 4 is mounted onto packaging substrate 15. The packaging substrate 15 may be a printed circuit board (PCB), molded leadframe, ceramic or any other packaging substrate. The IC die 4 may be mounted to the packaging substrate 15 and electrically connected via bondwires 3. Alternatively, the IC die 4 may be connected to the packaging substrate 15 by flip-chip methods. The IC die 4 may be connected to the packaging substrate 15 either before or after alignment of the opto-electronic component 5 and the optical port 9. The package may also include a lid (e.g., metal or ceramic), which may also define the package cavity, or other form of encapsulation (e.g., glob top).

It should be noted that there are many standard sizes for optical fibers in the industry. For example, single-mode optical fibers have relatively small cores, on the order of about 9 µm diameter. These single-mode fibers typically transmit infrared laser light, with wavelengths in the range of 1,300 to 1,550 nm. Multi-mode fibers have larger cores, on the order of about 62.5 µm in diameter. These multi-mode fibers typically transmit infrared light with wavelengths ranging from 850 to 1,300 nm. Although optical fiber cores are often made of glass, some optical fiber cores can be made from plastic. These optical fibers have a large core, on the order of approximately 1 mm in diameter. These plastic-core optical fibers typically and transmit visible red light with wavelengths of approximately 650 nm. The various embodiments outlined above may accommodate a variety of types of optical fiber.

Complementary three-dimensional (3D) alignment features 11, 13 on the IC die 4 and the optical port 9 may be mated together, thereby stably establishing the relative positions of the optical port 9 and the opto-electronic component 5. As used herein, "stably established" means that the relative positions are sufficiently secure to maintain alignment while the alignment features are mated, but does not necessarily entail retention in such position. The relative positions may be secure while the optical port is mechanically held in place (e.g., by hand or robotics), but the alignment features may be readily withdrawn from the mating position. Fixation subsequent to mating, for example by the use of an adhesive, can ensure retention. The complementary 3D alignment features may be corresponding male and female shapes. In FIG. 1, male shapes 11 protrude from the surface of the IC die 4, with mating or corresponding female shapes 13 formed as recesses in the optical port 9. Such protruding male shapes from the surface of the IC die can be formed, e.g., by depositing thick layers of photoresist or polyimide over the IC die 4. Lithography techniques, or lithography and etching, can then be used to remove the photoresist or polyimide from surrounding areas, leaving only the protruding male shape. Such features can be, for example, between about 20 to 50 µm in height. In other embodiments, the male alignment features may be located on the optical port, with the female alignment features positioned on the IC die. The corresponding 3D alignment features may be alignment pins and holes, recesses and knobs, grooves and protrusions, or any other pair of corresponding features that are sized and shaped to be mated with one another in a manner than can stably establish relative positions of the optical port 9 and the optical device 5 on the IC die 4.

Figure 2:
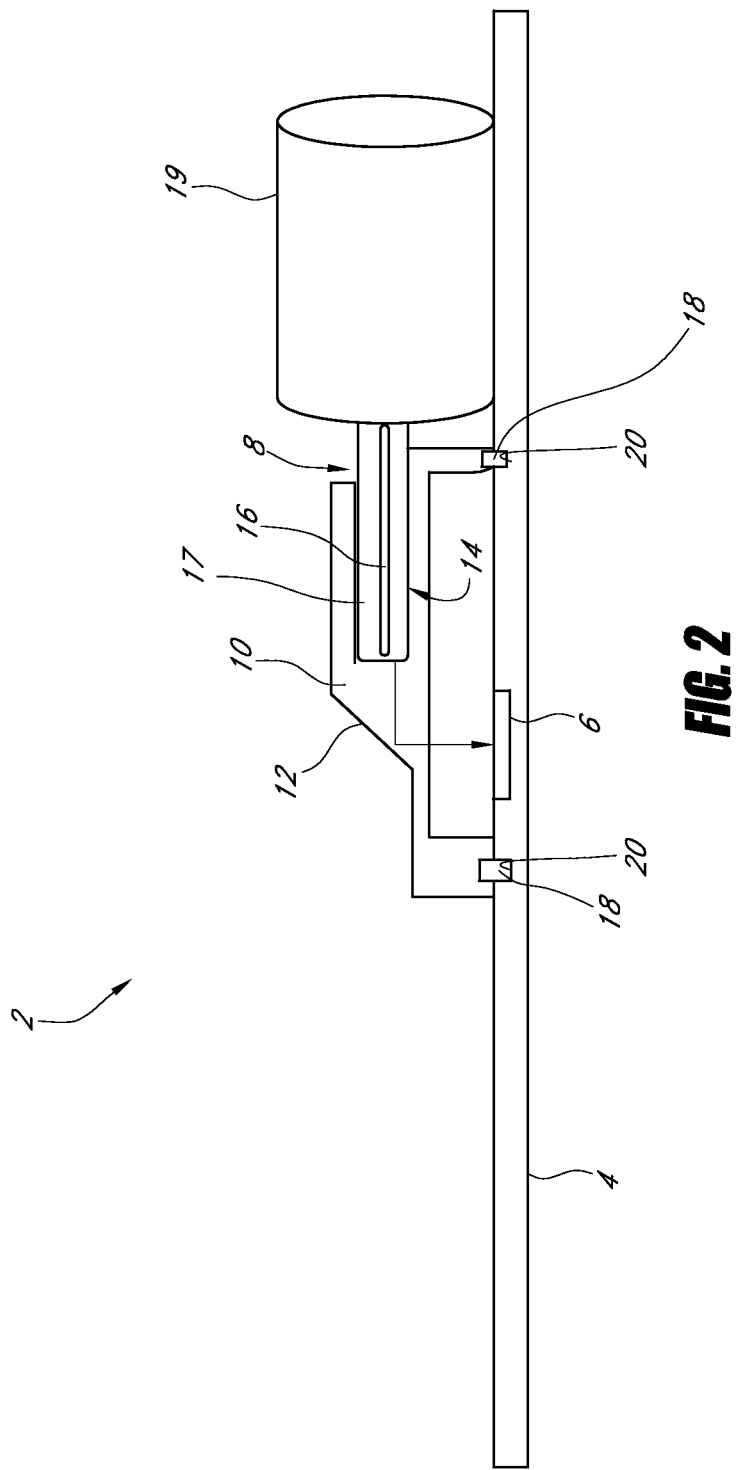
FIG. 2 shows a schematic elevational cross section of an opto-electronic system, according to another embodiment.

FIG. 2 shows a cross section of an opto-electronic system 2 according to one embodiment. An IC die 4 includes an integrated opto-electronic component 6. The integrated opto-electronic component 6 may be, for example, an integrated photodiode, LED, laser diode mounted on an IC, etc. An optical fiber 8 is optically coupled to the integrated opto-electronic component 6 by an optical port in the form of an optical fiber ferrule 10. The optical fiber ferrule 10 is positioned over the integrated opto-electronic component 6. The illustrated optical fiber ferrule 10 includes a turning mirror 12 and a channel or receptacle 14 for receiving the optical fiber 8. The optical fiber 8 includes a core 16 and a cladding 17 surrounding the core 16. A jacket 19 is illustrated surrounding a portion of the optical fiber 8, but not extending into the receptacle 14. In the case of a receiving opto-electronic component 6 (e.g., photodiode), light emitted from the optical fiber 8 is directed towards the turning minor 12 of the optical fiber ferrule 10. The emitted light is reflected from the turning mirror 12 and is redirected towards the integrated opto-electronic component 6. Similarly, in the case of an emitting opto-electronic component 6, light emitted by the integrated opto-electronic component 6 is redirected by the turning mirror 12 and into the optical fiber 8.

In this configuration, the optical fiber ferrule 10 serves as the optical port. The receptacle 14 of the optical fiber ferrule 10 receives the optical fiber 8. The optical fiber 8 may be inserted into the receptacle 14 manually or by aid of a machine. The height of the receptacle 14 may be configured such that the jacket 19 over the optical fiber 8 may lay flat on the surface of IC die 4. The optical fiber 8 (core 16 and cladding 17) may be secured into the receptacle 14 by a friction fit. Alternatively or additionally, an adhesive may be applied after positioning the core 16 in the receptacle 14. For example, after aligning and assembling the ferrule 10 and fiber 8 on the IC die 4, the entire assembly can be fixed and sealed by epoxy, e.g., glob top.

In order for the optical fiber 8 to be optically coupled to the integrated opto-electronic component 6, the optical fiber ferrule 10 may be aligned over the integrated opto-electronic component 6. "Aligned" as used herein indicates that the relative positions of the opto-electronic component 6 and the optical fiber ferrule 10 are such that optical communication is possible between the optical fiber 8 and the opto-electronic component 6. The bottom of the optical fiber ferrule 10 includes a plurality of alignment pins 18. The alignment pins 18 are dimensioned to mate with corresponding alignment holes 20 formed in the IC die, such that the alignment is stably established, i.e., alignment is ensured which the pins 18 are mated with the alignment holes 20. The alignment holes 20 are shown as extending partially through the IC die as blind holes. In alternative embodiments, the alignment holes may extend completely through the IC die as through holes. In still other embodiments, the alignment holes may extend only partially through the die from the backside of the IC die, without reaching the front side of the IC die, as will be discussed in more detail below.

The 3D alignment features need not be limited to pins and holes. Rather, any corresponding features capable of being mated to one another may be used. The alignment pins 18 may be formed integrally with the optical fiber ferrule through molding or other standard manufacturing techniques. The positions of the alignment holes 20 are carefully selected to correspond to the alignment pins 18 such that when the optical fiber ferrule 10 is positioned over the IC die, with the alignment pins 18 engaging the alignment holes 20, the turning minor 12 and optical fiber 8 will be precisely aligned with the integrated opto-electronic component 6. In addition, the alignment pins 18 and alignment holes 20 are each dimensioned such that upon mating of the alignment pins 18 with the alignment holes 20, the relative positions of the optical fiber ferrule 10 and the opto-electronic component 6 are stably established and can be fixed by additional means (e.g., epoxy).

This precision alignment may be achieved by using standard lithographic techniques during the fabrication of the IC die 4. For example, at the wafer level prior to dicing the wafer, the alignment holes 20 can be formed using wet chemical etching or dry etching, such as sputter etching or reactive ion etching. Laser drilling can also be employed without a mask. Advantageously, the alignment holes 20 may be formed at the wafer level using standard IC fabrication technology such as lithography, resulting in reduced cost and increased alignment precision, since at the wafer level precise positioning of the alignment holes 20 relative to the position of the opto-electronic component 6 involves only routine fabrication techniques forming aligning the wafer in the photolithography or other patterning equipment. In other embodiments, the alignment holes 20 may be formed after the IC die has been singulated, rather than at the wafer level.

The dimensions of the alignment holes are determined by the size and shape of the corresponding alignment features with which they are intended to mate. The size of the alignment holes and the corresponding alignment features are preferably such that, upon mating, the relative positions of the optical port and the opto-electronic component(s) integrated with the IC die are stably established to ensure optical communication between the optical port and the opto-electronic component(s). The absolute dimensions of the alignment holes and corresponding features are less important than the relative precision, which ensures a snug fit between them. In one embodiment, alignment holes may be circular (though other shapes are possible) with a diameter of between about 0.1 mm and 2 mm.

The depth of the alignment holes may vary as well. As noted above, the alignment holes may extend completely through the IC die, which are typically between 100 μm to 1 mm thick. The alignment holes need not, however, extend completely through the IC die. In some embodiments, the holes extend only partially into the IC die, to a depth sufficient to allow the corresponding alignment features to be received within, thereby stably establishing the relative positions of the opto-electronic component and the optical port to ensure optical communication between them. The depth of the alignment holes is determined consistent with the alignment tolerance of the intended application. In general, the tighter the alignment tolerances, the deeper the alignment hole. In some embodiments, the depths of the alignment holes may be at least approximately 20 μm. In some embodiments, the depths of the alignment holes may be at least approximately 100 μm. In some embodiments, the depths can extend to at least approximately 200 μm, up to a through-hole formed through the entire thickness of the IC die.

This approach advantageously allows for precise passive alignment without relying on the expensive and difficult process of aligning the optical port to the opto-electronic component(s) on a die using precise machine vision and expensive robots. Instead, the opto-electronic components may be mounted wherever desired, with arbitrary precision. The alignment precision comes instead at the point of forming the 3D alignment features in the IC die. As discussed above, using standard lithographic techniques renders this approach inexpensive and effective. By relying on alignment techniques already developed for lithographic processes, alignment tolerances of less than 1 μm may be readily achieved. During mounting, the optical port (e.g., ferrule 10) can be aligned within such tolerances to the die 4 and thus to the optical component 6 therein by much less sophisticated pick-and-place robotics, or even by hand.

Although the description of FIG. 2 relates to a single integrated opto-electronic component 6 aligned with a single optical fiber 8, the same technique may be applied to align multiple integrated opto-electronic components with multiple optical fibers. Additionally, a discrete opto-electronic component mounted and integrated with the IC may be used in place of an opto-electronic component formed within the semiconductor substrate of the IC.

Figure 3:
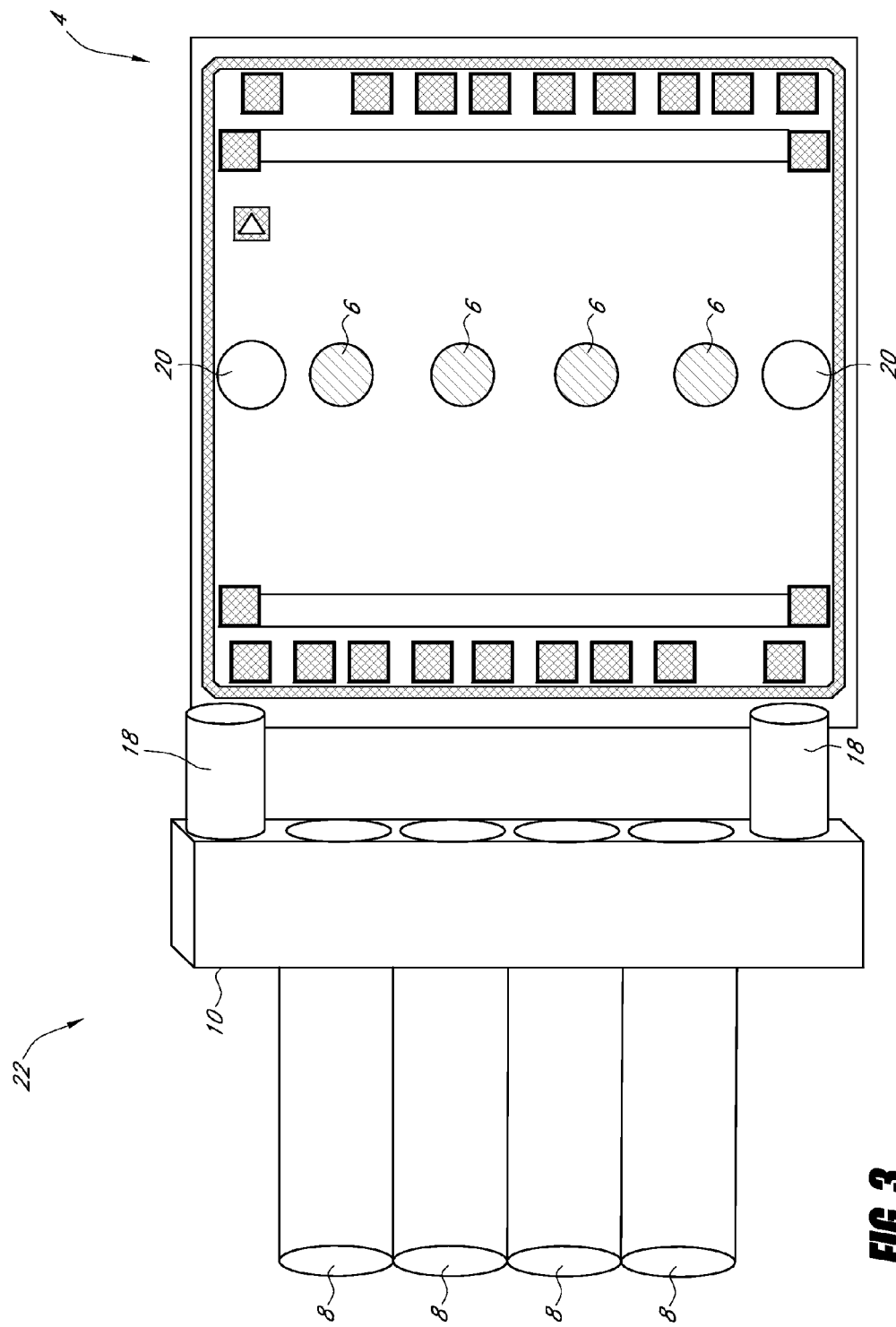
FIG. 3 shows a schematic top-down view of an opto-electronic system, according to another embodiment.

FIG. 3 shows a top-down view of an opto-electronic system 22, according to another embodiment. An IC die 4 is shown with various circuit elements on its top surface. Four integrated opto-electronic components 6 are formed in a line along the center of the IC die 4. As noted above with respect to FIG. 1, the opto-electronic components 6 may be, for example, integrated photodiodes formed within the substrate of the IC die 4. In some embodiments, the opto-electronic components need not be positioned in a single line, but may be distributed in any other geometry so long as it corresponds to the orientation of the optical fibers 8 in the optical port, which in the illustrated example is a 4-fiber optical fiber ferrule 10.

On each end of the line of integrated opto-electronic components 6 are alignment holes 20 formed in the IC die 4. The alignment holes 20 may extend completely through the IC die 4 as through-holes. In alternative embodiments, the alignment holes 20 may extend only partially through the IC die 4 as blind holes. In still other embodiments, the alignment holes 20 may extend only partially through the backside of the IC die 4, without reaching the front side of the IC die 4, as will be discussed in more detail with respect to the embodiments of FIGS. 5-6B below.

The optical fiber ferrule 10 includes alignment pins 18 configured to be mated with the alignment holes 20 formed in the top surface of the IC die 4. The optical fiber ferrule 10 is configured to receive four optical fibers 8 in a row. The geometric arrangement of the optical fibers 8 corresponds to the geometric arrangement of the integrated opto-electronic components 6 in the IC die 4. When the alignment pins 18 are mated with the alignment holes 20, the optical fiber ferrule 10 is positioned over the IC die 4, such that the four optical fibers 8 are aligned with the four integrated opto-electronic components. Once the alignment features are mated, optical communication between each optical fiber 8 and its corresponding integrated opto-electronic component 6 is enabled. The alignment features need not be limited to pins and holes, as shown, but may instead be virtually any corresponding shapes that permit the alignment features on the optical fiber ferrule 10 to be physically mated with the alignment features in the IC die 4. Conveniently, the male alignment features are formed on the optical port and the mating female alignment features are formed in the IC die 4 of the illustrated embodiment.

The alignment pins 18 may be formed integrally with the optical fiber ferrule through molding or other standard manufacturing techniques. The positions of the alignment holes 20 are carefully selected to correspond to the alignment pins 18 such that when the optical fiber ferrule 10 is positioned over the IC die, with the alignment pins 18 engaging the alignment holes 20, the optical fibers 8 will be precisely aligned with the integrated opto-electronic components 6. As discussed above, this precision alignment may be achieved by using standard lithographic techniques on the IC die 4 after placement or formation of the integrated opto-electronic components 6. Once the opto-electronic components 6 are formed, the alignment holes 20 are formed using chemical etching, ion etching, laser drilling, or any other suitable means of forming 3D alignment features in a precise location on an IC die 4. Alternatively, the integrated opto-electronic components 6 may be disposed on or formed within the IC die 4 after the alignment holes 20 are formed using the standard lithographic techniques discussed above.

Advantageously, the alignment holes 20 may be formed simultaneously for dozens of IC dies while the IC die 4 is still in wafer form, resulting in reduced cost and increased alignment precision. Use of semiconductor wafer fabrication techniques and equipment to position and form the 3D alignment features on the IC die permit alignment tolerances of less than 10 μm to be achieved without use of expensive robotics and machine vision at the point of assembly. In certain embodiments, alignment tolerances of less than 1 μm can be achieved. In some embodiments, the alignment holes 20 may be formed after the IC die has been singulated, such as by laser drilling.

Figure 4:
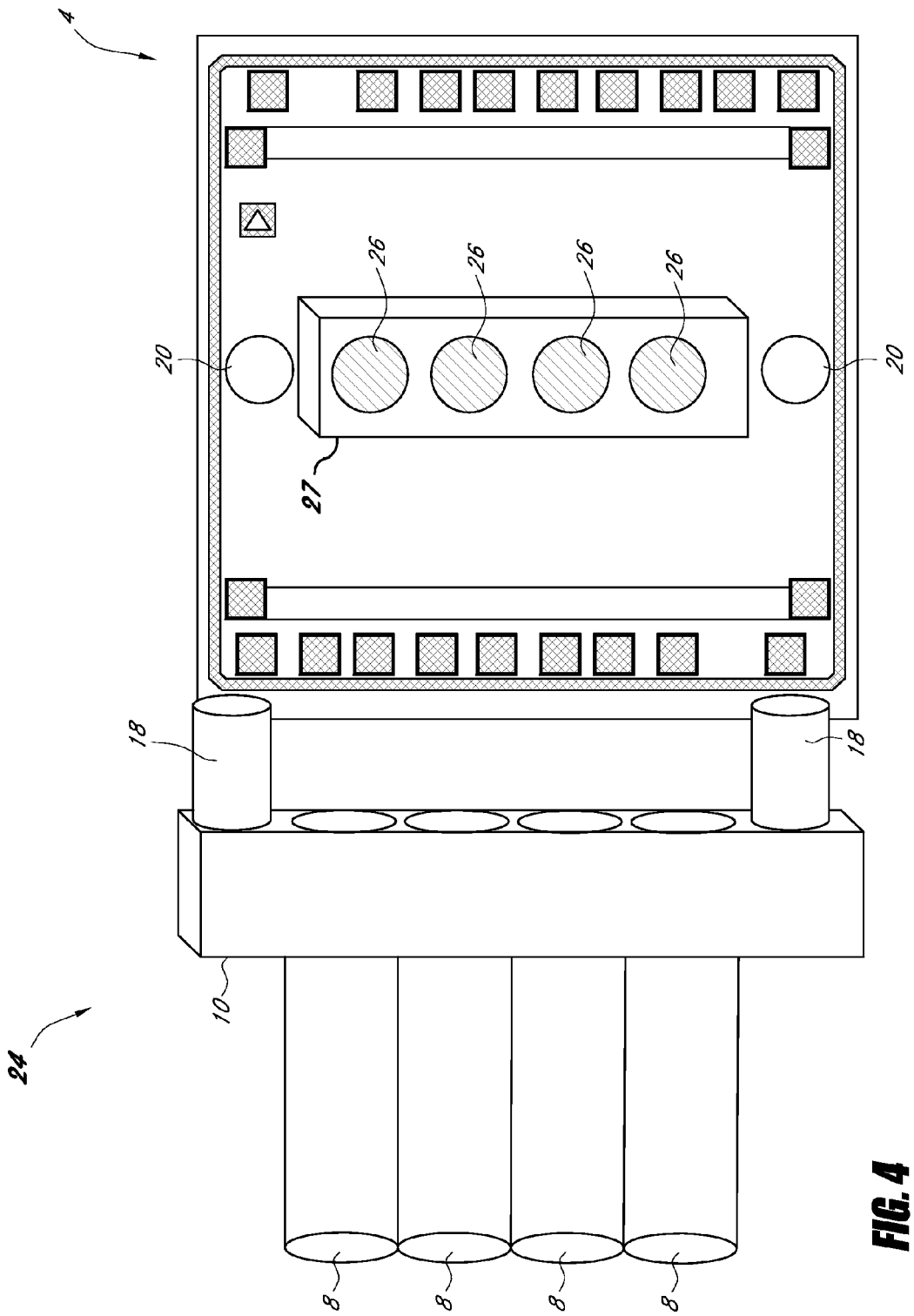
FIG. 4 shows a schematic top-down view of an opto-electronic system, according to another embodiment.

FIG. 4 shows a top-down view of an opto-electronic system 24 according to another embodiment. The system 24 is similar to that illustrated in FIG. 3, except that instead of integrating opto-electronic components 6 within the IC die 4, discrete opto-electronic components 26 are integrated by hybridly attaching the components 26 with the surface of the IC die 4. As used in this sense, "hybridly attached" means that the opto-electronic components 26 are electrically integrated with and physically connected to the IC die 4. Unlike the integrated opto-electronic components 6 discussed above, which are formed within the IC die 4, the discrete opto-electronic components 26 are formed separately and then mounted onto the surface of the IC die 4. The discrete opto-electronic components may be, for example, a series of laser diodes arranged into a laser bar 27, which can be formed on and diced from a wafer separate from the wafer in which the IC die 4 was formed. The opto-electronic components 26 may be identical, for example all four may be discrete photodiodes. In other implementations, however, the opto-electronic components may vary from one another. For example, in embodiments with four aligned opto-electronic components, two may be emitters (for example, laser diodes), and two may be receivers (for example, photodiodes). Various other combinations of opto-electronic components are possible.

Similar to FIG. 3, the optical fiber ferrule 10 is dimensioned such that when alignment pins 18 are mated with alignment holes 20, the optical fibers 8 are each aligned with one of the discrete opto-electronic components 26. The alignment holes 20 are formed using standard lithographic techniques as described above.

Figure 5:
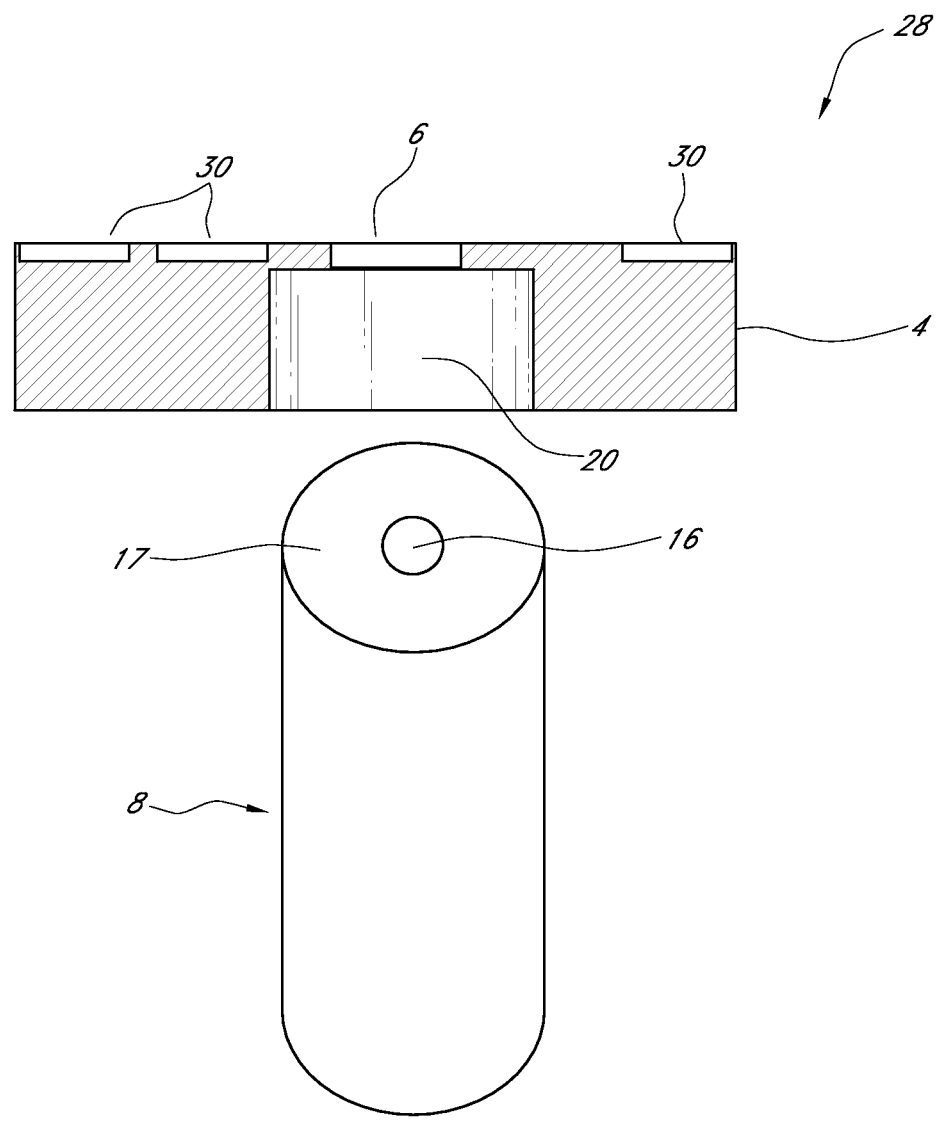
FIG. 5 shows a schematic elevational cross section of an opto-electronic system, according to another embodiment.

FIG. 5 illustrates a side view of an opto-electronic system 28, according to another embodiment. An IC die 4 includes an integrated opto-electronic component 6 within the die substrate, near its top surface, along with a plurality of other IC components 30 (e.g., transistors, resistors, etc.). Contact or bond pads may also be arranged on the top surface of the IC die 4. In this system 28, the optical fiber 8 optically communicates with the integrated opto-electronic component 6 from the back side of the IC die 4. An alignment hole 20 is formed in the back side of the IC die 4 directly beneath the integrated opto-electronic component 6. The remaining thickness of the IC die 4 between the alignment hole 20 and the integrated opto-electronic component 6 is thin enough to allow optical communication therethrough. In the illustrated embodiment, the alignment hole 20 is formed in a homogeneous substrate, for example a silicon wafer. In other embodiments, however, a buried oxide layer can be included in the IC die, such as for silicon-on-insulator (SOI) applications, which conveniently provides a pre-determined etchant stopping point. In such embodiments, the buried oxide layer can form the upper surface of the alignment hole 20. In some embodiments, use of a buried oxide layer can provide for a better surface for optical communication therethrough. The alignment hole may be formed, preferably at the wafer level along with similar holes for several other dies, using semiconductor fabrication techniques described above with respect to previously described embodiments.

The IC die 4 may optionally be mounted to a packaging substrate (not shown) via bondwires. For example, a packaging substrate, such as a PCB, can be provided that contains a hole at least as large as the alignment hole 20. In certain embodiments, the hole in the packaging substrate can be significantly larger than the alignment hole 20. The IC die 4 can be mounted onto the packaging substrate such that the alignment hole 20 is still accessible through the hole in the packaging substrate. Electrical connection between the IC die 4 and the packaging substrate can be provided by wirebonds. Alternatively, the IC die 4 can be mounted onto a packaging substrate by bumped die flip-chip methods. For example, solder balls can be disposed over contact pads on the top surface of the IC die 4. A packaging substrate is then provided with preformed bond pads arranged to correspond to the contact pads on the top surface of the IC die 4. The packaging substrate is then placed over the top surface of the IC die 4, with the packaging substrate bond pads aligned with the contact pads of the IC die 4. The contact pads and bond pads are then soldered together using the balls of solder, thereby providing mechanical and electrical connection.

The optical fiber 8 includes an optical fiber core 16 and a cladding 17 that surrounds the core 16. The alignment hole 20 in the IC die 4 is dimensioned such that the outer surface of the cladding 17 (and thus the outer surface of the optical fiber 8) fits snugly within it. In this sense, the optical fiber 8 itself forms the optical port and the optical fiber (or at least the outer surface thereof) also serves as the alignment feature on the optical fiber 8 corresponding to the alignment hole 20. When the optical fiber 8 is received within the alignment hole 20, the core 16 is aligned with the integrated opto-electronic component 6, within ±10 μm, allowing direct optical communication between the two. In certain embodiments, the core 16 can be aligned with the integrated opto-electronic component 6 to within ±1 μm. The optical fiber 8 may be maintained within the alignment hole 20 by friction fit, with the use of an adhesive, or by any other suitable means. When the optical fiber 8 is mated with the alignment hole 20, the relative positions of each are stably established, thereby ensuring optical communication between the optical fiber 8 and the opto-electronic component 6. As with the previously described embodiments, the fit between the optical fiber 8 and the alignment hole 20 holds the fiber sufficiently stably for the package to be subsequently fixed, e.g., by epoxy glob top with the fiber 8 and optical component 6 in optical communication. The dimensions are such that low cost robotics or even human hands can fit the fiber 8 into the alignment hole 20 during assembly for packaging.

Figure 6A:
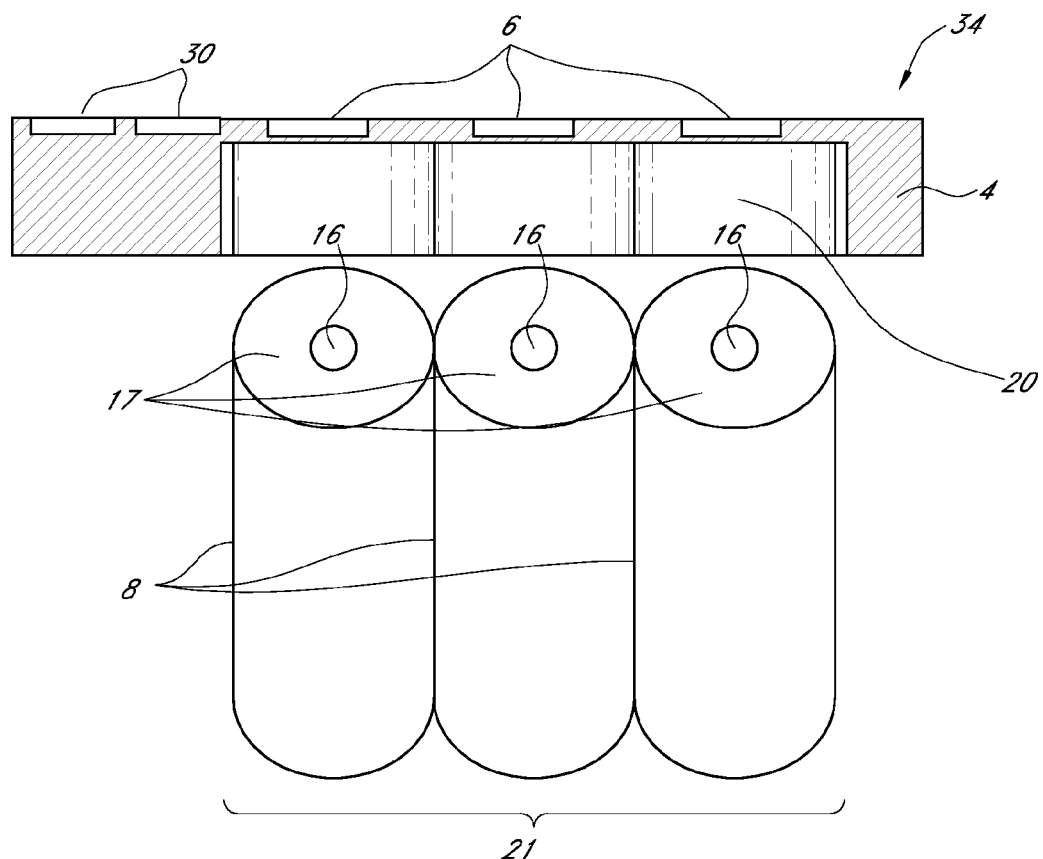
FIG. 6A shows a schematic elevational cross section of an opto-electronic system, according to another embodiment.
Figure 6B:
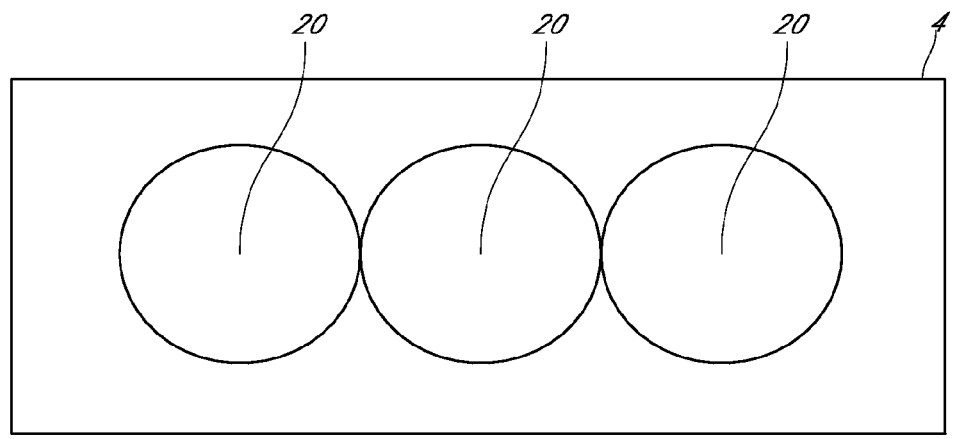
FIG. 6B shows a bottom view of an integrated circuit (IC) die of the system of FIG. 6A.

FIGS. 6A and 6B illustrate an opto-electronic system 34 according to another embodiment. Similar to that illustrated in FIG. 5, an IC die 4 includes various circuit elements 30 and a plurality of integrated opto-electronic components 6 formed within or on a top surface of the substrate forming the die, and alignment holes 20 formed in the back surface. In this configuration, however, the alignment holes 20 are dimensioned to receive not a single optical fiber 8, but rather a ribbon 21 containing a plurality of individual fibers 8 bound together. Although shown here containing three optical fibers 8, the ribbon may, in other embodiments, include two, three, four or more optical fibers. Industry standard ribbons often include twelve (12) optical fibers. Each optical fiber 8 includes an optical fiber core 16, and cladding 17 that surrounds and separates the cores 16 from one another. The alignment holes 20 are dimensioned to be mated with the outer surface of the individual optical fibers 8 of the optical fiber ribbon. Accordingly, the outer surface of the optical fibers 8 forms both the optical port and the corresponding alignment feature(s). Similar to FIG. 5, the alignment holes 20 are made using standard semiconductor fabrication (e.g., lithographic or laser drilling) alignment and etching techniques for backside alignment with the integrated opto-electronic components 6 at or near the top surface of the IC die 4.

The dimensions of the alignment holes 20 are configured so as to receive the outer surface of ribbon 21, thereby stably establishing the relative positions of the optical fibers 8 and the opto-electronic components 6. In this configuration, the outer surface of the individual optical fibers 8 forms both the optical port and the male alignment features corresponding to the female alignment holes 20. FIG. 6B illustrates a bottom view of the IC die 4, in which the alignment holes 20 have shapes corresponding to the plurality of optical fibers 8.

When the optical fibers 8 are received within the alignment holes 20, the cores 16 are each precisely aligned with the integrated opto-electronic components 6, allowing direct optical communication therebetween. The optical fibers 8 may be maintained within the alignment holes 20 by friction fit, with the use of an adhesive, or by any other suitable means. As with the previously described embodiments, the fit between the optical fibers 8 and the alignment holes 20 holds the fibers sufficiently stably for the package to be subsequently fixed, e.g., by epoxy glob top. The dimensions are such that low cost robotics or even human hands can fit the fibers 8 into the alignment holes 20 during assembly for packaging. Similar to FIG. 5, electrical connection between the IC die 4 and a packaging substrate can be provided by wirebonds or bumped die flip-chip methods.

Figure 7:
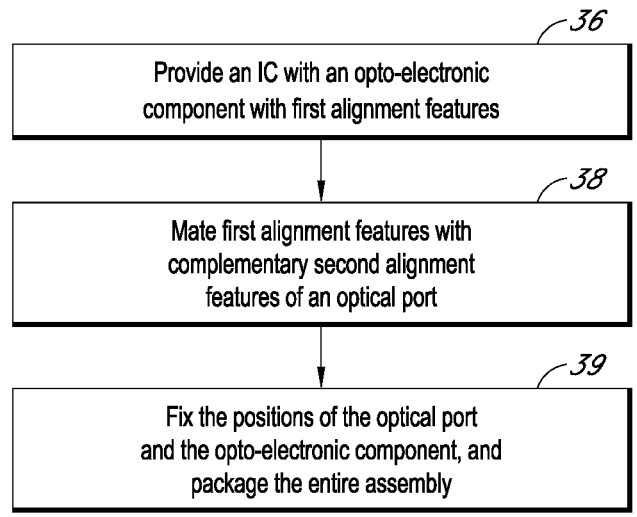
FIG. 7 shows a flow chart illustrating a method for assembling an opto-electronic system, according to an embodiment.

FIG. 7 shows a flow chart diagram illustrating a method for manufacturing an opto-electronic system, according to one embodiment. Block 36 describes providing an IC with an opto-electronic component and first alignment features. The opto-electronic component may be integrated within the same substrate as the IC circuitry, or may be an initially discrete component that is electrically and physically integrated with the IC die. Examples of discrete opto-electronic components include discrete photodiodes and discrete lasers mounted on a chip. Block 38 describes mating the first alignment features with complementary second alignment features of an optical port. The first and second features may be 3D features, for example alignment pins and holes, recesses and knobs, grooves and protrusions, male-female shaped pairs, or any other pair of corresponding features that can be physically mated with one another. The corresponding features may be dimensioned such that upon mating, the relative positions of the optical port and the opto-electronic component are stably established to ensure optical communication between the two.

The optical port can be an optical fiber ferrule, which may or may not include a turning minor. Alternatively, the optical port can be a lens array, a waveguide, a planar light circuit, an optical couple, or a modulator. The optical port may also comprise the outer surface of the cladding surrounding and integrated with an optical fiber. The optical port is configured to communicate with an optical signal carrier. For example, the optical signal carrier can be an optical fiber, or an optical fiber ribbon sheathing multiple fibers within.

Block 39 describes fixing the relative positions of the optical port and the opto-electronic component. This may be done through, for example, the application of an adhesive. The entire assembly may be coated with epoxy, or "glob top", or alternatively adhesive may be applied only select areas around the alignment features. Once the positions of the optical port and opto-electronic component positions are permanently established, the entire assembly may mounted onto a packaging substrate. Alternatively, the IC can be mounted onto a packaging substrate prior to blocks 38 and 39.

Figure 8:
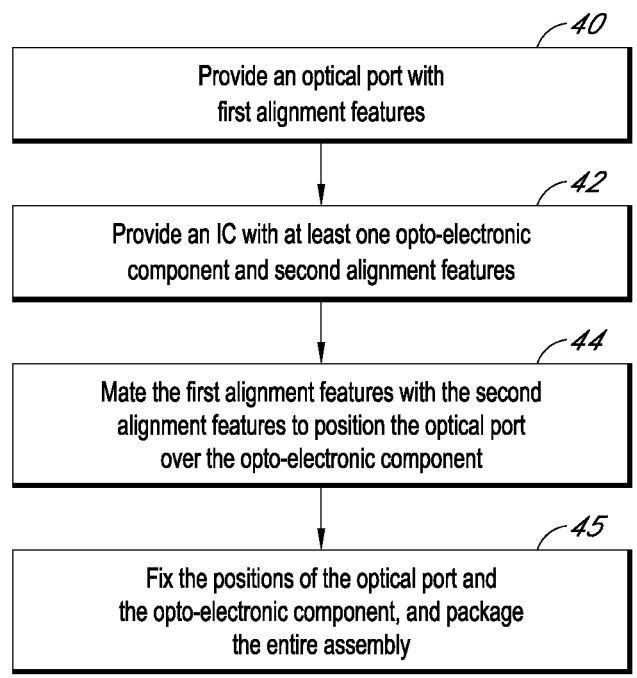
FIG. 8 shows a flow chart illustrating a method for assembling an opto-electronic system, according to another embodiment.

FIG. 8 shows a flow chart diagram illustrating a method for manufacturing an opto-electronic system, according to another embodiment. Block 40 describes providing an optical port with first alignment features. As described above, the optical port can be an optical fiber ferrule, which may or may not include a turning minor. Alternatively, the optical port can be a lens array, a waveguide, a planar light circuit, an optical couple, or a modulator. The optical port may also comprise the outer surface of the cladding surrounding and integrated with an optical fiber. The optical port is configured to communicate with an optical signal carrier. For example, the optical signal carrier can be an optical fiber, or an optical fiber ribbon sheathing multiple fibers within. Block 42 describes providing an IC with at least one opto-electronic component and second alignment features. As noted above, the opto-electronic component may be either integrated within the same substrate as the IC circuitry, or may be an initially discrete component that is electrically and physically integrated with the IC die. Examples of opto-electronic components include photodiodes or lasers. Block 44 describes mating the first alignment features on the optical port with the second alignment features on the opto-electronic component. Once mated, the optical port is precisely aligned with the opto-electronic component, such that when an optical signal carrier such as an optical fiber is in communication with the optical port, the opto-electronic component may optically communicate directly with the optical fiber.

Block 45 describes fixing the relative positions of the optical port and the opto-electronic component. This may be done through, for example, the application of an adhesive. The entire assembly may be coated with epoxy, or "glob top", or alternatively adhesive may be applied only select areas around the alignment features. Once the positions of the optical port and opto-electronic component positions are permanently established, the entire assembly may mounted onto a packaging substrate. Alternatively, the IC can be mounted onto a packaging substrate prior to blocks 44 and 45.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An opto-electronic system comprising:
   an optical port configured to be coupled to at least one optical signal carrier, wherein the optical port includes first three-dimensional (3D) alignment features; and
   an integrated circuit (IC) die comprising:
      at least one opto-electronic component;
      other integrated circuitry within the IC die; and
      second 3D alignment features formed in the IC die, the second 3D alignment features complementary to the first 3D alignment features and configured to be mated therewith to align the optical signal carrier with the opto-electronic component.

2. The system of claim 1, wherein the optical port is further configured to be coupled to a second optical signal carrier, and the IC die further comprises a second opto-electronic component, such that when the second optical signal carrier is coupled to the optical port and the first 3D alignment features are mated with the second 3D alignment features, the second optical signal carrier is substantially aligned with the second opto-electronic component.

3. The system of claim 1, wherein the optical port comprises an optical fiber ferrule and the optical signal carrier comprises an optical fiber.

4. The system of claim 1, wherein:
   an optical fiber serves as the optical signal carrier and the optical port, and the first 3D alignment features comprise the outer surface of the optical fiber;
   the second 3D alignment features comprise an alignment hole in a bottom surface of the IC die directly beneath the opto-electronic component;
   the alignment hole does not extend completely through the IC die; and
   the alignment hole is configured such that the opto-electronic component can optically communicate from a bottom side of the IC die.

5. The system of claim 1, wherein the optical signal carrier comprises an optical fiber ribbon sheathing multiple fibers.

6. The system of claim 1, wherein the opto-electronic component comprises at least one photodiode integrated within a semiconductor substrate of the IC die.

7. The system of claim 1, wherein the opto-electronic component comprises at least one laser or photodiode hybridly attached to a semiconductor substrate of the IC die.

8. The system of claim 1, wherein the optical port is selected from the group consisting of a waveguide, a planar light circuit, an optical coupler, a lens array and a modulator.

9. The system of claim 1, wherein the first and second 3D alignment features comprise male and female complementary shapes, respectively.

10. The system of claim 9, wherein the first 3D alignment features comprise alignment pins, and the second 3D alignment features comprise alignment holes.

11. The system of claim 10, wherein the alignment holes do not pass all the way through the IC die.

12. The system of claim 10, wherein the alignment holes are open on a top surface of the IC die, wherein the top surface comprises at least one contact pad.

13. The system of claim 10, wherein the alignment holes are open on a bottom surface of the IC die, wherein the bottom surface is opposite a top surface comprising at least one contact pad.

14. A method of fabricating a device, the method comprising:
   providing a semiconductor substrate comprising an integrated circuit, the integrated circuit comprising at least one opto-electronic component and other integrated circuitry within the semiconductor substrate; and
   forming first three-dimensional (3D) alignment features in the semiconductor substrate, wherein the first 3D alignment features are configured to mate with complementary second 3D alignment features of an optical port to stably establish relative positions of the integrated circuit and the optical port and allow optical communication between the opto-electronic component and the optical port.

15. The method of claim 14, wherein the opto-electronic component comprises at least one photodiode within the semiconductor substrate.

16. The method of claim 14, wherein the opto-electronic component comprises at least one laser electrically integrated and physically attached to the semiconductor substrate.

17. The method of claim 14, wherein the first 3D alignment features are holes, and the second 3D alignment features are pins.

18. The method of claim 17, wherein forming the alignment holes comprises laser drilling.

19. The method of claim 17, wherein forming the alignment holes comprises chemical etching.

20. The method of claim 17, wherein forming the alignment holes comprises ion beam etching.

21. The method of claim 14, further comprising positioning the optical port over the integrated circuit by mating the first 3D alignment features with the second 3D alignment features on the optical port.

22. The method of claim 21, wherein the optical port comprises an optical fiber, and the second 3D alignment features comprise the outer surface of the optical fiber.

23. An integrated circuit (IC) die configured to receive an aligned optical port thereon, the IC die comprising:
  at least one opto-electronic component hybridly attached to the IC die, the opto-electronic component configured to optically communicate with an optical port; and
  first three-dimensional (3D) alignment features formed in the IC die at locations spaced apart from the opto-electronic component and configured be mated with complementary second 3D alignment features of the optical port to stably establish relative positions of the IC die and the optical port and allow optical communication between the opto-electronic component and the optical port.

24. The IC die of claim 23, comprising a plurality of opto-electronic components hybridly attached to the IC die, the plurality of opto-electronic components configured to optically communicate with the optical port.

25. The IC die of claim 23, wherein the opto-electronic component comprises a laser or a photodiode electrically integrated and physically attached to a top surface of a semiconductor substrate.

26. The IC die of claim 23, wherein the first 3D alignment features are female shapes, and the second 3D alignment features are complementary male shapes.

27. A method of attaching an optical port to an integrated circuit (IC), the method comprising the steps of:
  providing an optical port comprising first three-dimensional (3D) alignment features;
  providing an IC die comprising at least one opto-electronic component hybridly attached to the IC die, and second 3D alignment features formed in the IC die, wherein the second 3D alignment features are complementary to the first 3D alignment features;
  positioning the optical port over the opto-electronic component by mating the first 3D alignment features with the second 3D alignment features.

28. The method of claim 27, wherein the first 3D alignment features are male shapes, and the second 3D alignment features are complementary female shapes.

29. The method of claim 27, further comprising fixing the optical port to the IC die while positioning the optical port over the optical component.

30. The method of claim 27, further comprising mounting the IC die onto a packaging substrate before positioning the optical port over the opto-electronic component.

31. The method of claim 27, further comprising coupling an optical signal carrier to the optical port.

* * * * *